United States Patent
Kubena et al.

(10) Patent No.: US 8,569,937 B1
(45) Date of Patent: Oct. 29, 2013

(54) PIEZOELECTRIC RESONATOR WITH CAPACITIVE SENSE AND/OR FORCE REBALANCE ELECTRODES TO CONTROL AN AMPLITUDE OF VIBRATION

(75) Inventors: Randall L. Kubena, Oak Park, CA (US); Yook-Kong Yong, Princeton, NJ (US)

(73) Assignee: HRL Laboratories, LLC, Malibu, CA (US)

( * ) Notice: Subject to any disclaimer, the term of this patent is extended or adjusted under 35 U.S.C. 154(b) by 212 days.

(21) Appl. No.: 12/835,610

(22) Filed: Jul. 13, 2010

(51) Int. Cl.
  *H03H 9/125* (2006.01)
(52) U.S. Cl.
  USPC ........... 310/366; 310/309; 310/318; 310/320; 310/330; 310/332
(58) Field of Classification Search
  USPC .......... 310/309, 318, 321, 366, 330, 331, 332
  See application file for complete search history.

(56) References Cited

U.S. PATENT DOCUMENTS

| | | |
|---|---|---|
| 3,012,204 A | 12/1961 | Dransfeld |
| 3,401,354 A | 9/1968 | Seidel |
| 3,816,753 A | 6/1974 | Kino |
| 4,145,929 A | 3/1979 | Aske |
| 4,320,320 A | 3/1982 | Momosaki et al. |
| 4,419,600 A | 12/1983 | Sinha |
| 4,544,897 A | 10/1985 | Ishikawa |
| 4,872,765 A | 10/1989 | Schodowski |
| 5,652,556 A | 7/1997 | Flory et al. |
| 5,701,049 A * | 12/1997 | Kanayama et al. ........... 310/359 |
| 5,752,410 A | 5/1998 | Bernstein |
| 5,912,594 A | 6/1999 | Burkhard |
| 5,939,815 A * | 8/1999 | Kosinski ........................ 310/318 |
| 5,966,053 A | 10/1999 | Durig et al. |
| 7,459,099 B2 | 12/2008 | Kubena et al. |
| 7,633,213 B2 * | 12/2009 | Takayama et al. ............. 310/331 |
| 2001/0002807 A1 * | 6/2001 | Yoshida et al. ................ 333/187 |
| 2002/0050882 A1 * | 5/2002 | Hyman et al. ................... 335/78 |
| 2006/0162453 A1 * | 7/2006 | Mikado et al. .............. 73/514.29 |
| 2007/0176701 A1 | 8/2007 | Nakamura et al. |
| 2007/0194665 A1 * | 8/2007 | Takei et al. ..................... 310/340 |
| 2008/0067892 A1 * | 3/2008 | Chiba et al. .................... 310/314 |
| 2010/0093125 A1 * | 4/2010 | Quevy et al. ..................... 438/50 |
| 2011/0260802 A1 | 10/2011 | Villanueva Torrijo et al. |

OTHER PUBLICATIONS

U.S. Appl. No. 12/954,475 "Parametrically Driven Quartz UHF Oscillator," Randall L. Kubena, et al., Application & Office Actions.
U.S. Appl. No. 12/954,475, filed Nov. 24, 2010, Kubena.

* cited by examiner

*Primary Examiner* — Derek Rosenau
*Assistant Examiner* — Bryan Gordon
(74) *Attorney, Agent, or Firm* — Ladas & Parry

(57) ABSTRACT

In an embodiment, a piezoelectric resonator configured for parametric amplification is disclosed. The piezoelectric resonator may include or comprise a piezoelectric member, and first and second resonator electrodes associated with the piezoelectric member and positioned to enable a first electric field to be generated in a first direction. The piezoelectric resonator may also include or comprise a parametric drive electrode associated with the piezoelectric member and positioned to enable a second electric field to be generated in a second direction.

10 Claims, 11 Drawing Sheets

Generate a first electric field between first and second resonator electrodes so as to oscillate a piezoelectric member of the piezoelectric resonator in a first direction at an operating or resonate frequency
610

Generate a second electric field between first and second parametric drive electrodes so as to exert a degree of strain on the piezoelectric member in a second direction at twice the operating or resonate frequency to thereby parametrically drive the piezoelectric member in the second direction
620

PIEZOELECTRIC RESONATOR WITH CAPACITIVE SENSE AND/OR FORCE REBALANCE ELECTRODES TO CONTROL AN AMPLITUDE OF VIBRATION

TECHNICAL FIELD

The present technology relates to the field of resonator devices.

BACKGROUND

Electronic systems have become ubiquitous in many modern societies, wherein these systems may be used to perform various tasks electronically, such as to increase the ease and efficiency with which certain tasks may be carried out. Oftentimes, it is useful in such electronic systems that an electrical signal be created with a particular frequency, such as to provide a stable clock signal for digital integrated circuits.

SUMMARY

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

In an embodiment, a piezoelectric resonator is disclosed, wherein the piezoelectric resonator may include or comprise a piezoelectric member, resonator electrodes disposed on said piezoelectric member and positioned to enable a first electric field to be generated in a first direction in said piezoelectric member; and a plurality of capacitive sense and/or force rebalance electrodes disposed on said piezoelectric member and positioned to control an amplitude of vibration of said piezoelectric resonator in said first direction, said plurality of capacitive sense and/or force rebalance electrodes being spaced from said resonator electrodes.

In an embodiment, a piezoelectric resonator is disclosed, wherein the piezoelectric resonator may include or comprise a piezoelectric member, and a resonator electrode associated with the piezoelectric member and positioned to enable a first electric field to be generated in a first direction. The piezoelectric resonator may also include or comprise a plurality of capacitive sense and/or force rebalance electrodes associated with the piezoelectric member and positioned to control an amplitude of vibration of the piezoelectric resonator in the first direction.

Moreover, in an embodiment, an oscillator is disclosed. The oscillator may include or comprise a substrate, and a piezoelectric member coupled with and cantilevered relative to the substrate. The oscillator may also include or comprise a resonator electrode coupled with the piezoelectric member and positioned to enable a first electric field to be generated in a first direction. The oscillator may further include or comprise a parametric drive electrode coupled with the piezoelectric member and positioned to enable a second electric field to be generated in a second direction.

Furthermore, in accordance with one embodiment, a method of using parametric amplification to increase a quality factor of a piezoelectric resonator is disclosed. The method may include or comprise selecting a piezoelectric member, generating a first electric field to oscillate the piezoelectric member in a first direction, and generating a second electric field to parametrically drive the piezoelectric member in a second direction.

Additionally, a method to reduce the vibration sensitivity of an oscillator using an additional electrode both on the substrate and in the capping wafer. These electrodes are used in combination with capacitive sense electrodes to stabilize the resonator and thereby reduce the phase noise. This may be particularly important, for example, when using resonators having relatively high quality factors.

DESCRIPTION OF THE DRAWINGS

The accompanying drawings, which are incorporated in and form a part of this specification, illustrate embodiments of the present technology, and, together with the Detailed Description, serve to explain principles discussed below.

FIG. 6 is a first exemplary method of using parametric amplification to increase a quality factor of a piezoelectric resonator in accordance with an embodiment.

Figure 1:
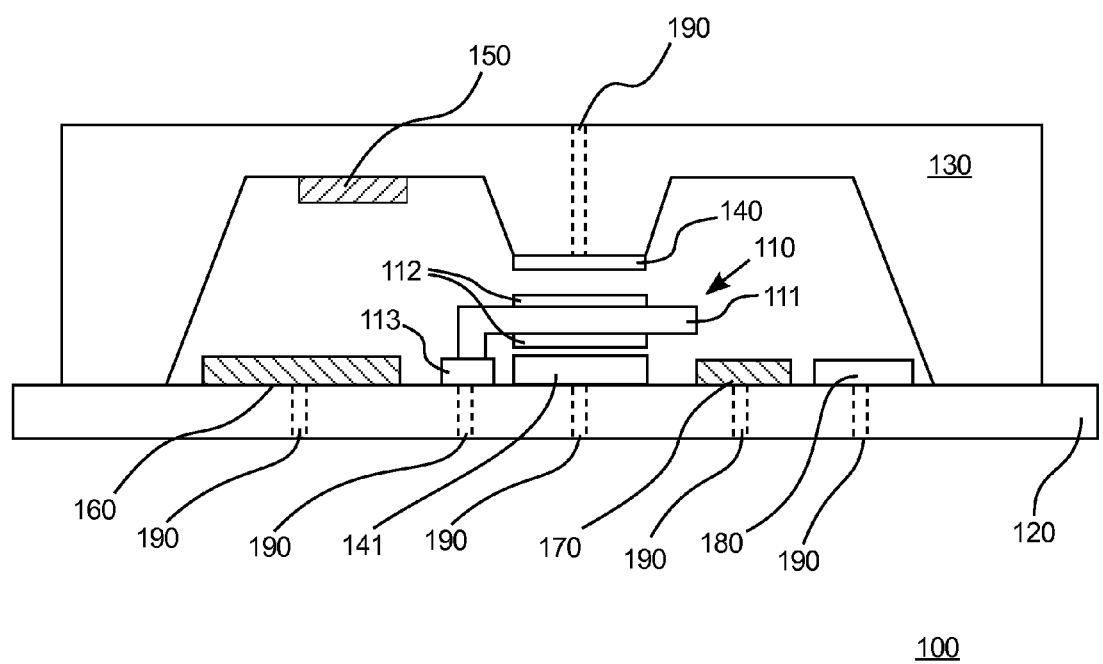
FIG. 1 is a side view of an oscillator package in accordance with an embodiment.

The drawings referred to in this description are not to be understood as being drawn to scale except if specifically noted, and such drawings are only exemplary in nature.

DETAILED DESCRIPTION

Reference will now be made in detail to embodiments of the present technology, examples of which are illustrated in the accompanying drawings. While the present technology will be described in conjunction with various embodiments, these embodiments are not intended to limit the present technology. Rather, the present technology is to be understood as encompassing alternatives, modifications and equivalents, which may be included within the spirit and scope of the various embodiments as defined by the appended claims.

Furthermore, in the following Detailed Description numerous specific details are set forth in order to provide a thorough understanding of the present technology. However, the present technology may be practiced without these specific details. In other instances, well-known methods, procedures, components, and circuits have not been described in detail so as to not unnecessarily obscure aspects of the exemplary embodiments presented herein.

For purposes of clarity, it is noted that the term "plurality" as used herein shall be synonymous with the expression "two or more".

Overview

An embodiment of the present technology discloses a thermally-compensated piezoelectric resonator structure, which may be implemented in a high performance oscillator, and in which high-gain parametric amplification can be achieved with an integrated on-chip design with relatively low drive voltages for integration with other electronics. In particular, lateral field excitation is used to strain a shear-mode resonator at, for example, twice its resonant frequency to produce a variation in its elastic modulus which will parametrically amplify its fundamental mode amplitude. In an embodiment, the lateral strain is generated using a lateral electrostatic driving force adjacent to the resonator.

In one embodiment, the piezoelectric resonator structure includes quartz due to the relatively high quality factor (Q) and temperature stability of quartz. Additionally, the effective elastic modulus (as well as other piezoelectric constants) of a quartz resonator can be changed slightly when the resonator undergoes vibration. It is noted that vibration levels within the $10^4$ to $10^5$ "g" range (wherein "g" is the acceleration of gravity, or 9.81 meters ("m") per square second ("$s^2$")), can produce relative changes in the material constants of quartz on the order of $10^{-4}$ to $10^{-5}$. Thus, in accordance with an exemplary scenario, forces that produce equivalent strain in the quartz can be used for parametric amplification depending on the native quality factor of the resonator. This level of excitation may be driven at low voltages if the electrodes are located within a few microns ("μm") of the active resonator. By implementing wafer-level quartz processing, these dimensions can be achieved in an integrated on-chip design.

For temperature compensated resonators such as AT-cut shear-mode resonators, an embodiment provides that the shear-modulus is modulated at twice the operating frequency for parametric amplification to be achieved. Normally, flexural and extensional stresses do not significantly affect the elastic shear modulus. However, by applying an electric field at sufficient amplitude laterally across the device, such as normal to the direction of shear, one can modulate the shear modulus. Indeed, for narrow, ultra-high frequency ("UHF") micro-electromechanical systems ("MEMS") resonator designs, the drive electrodes can be applied to the side, top and/or bottom surfaces of the resonator to provide sufficient lateral electric fields at relatively low voltages.

Various exemplary embodiments of the present technology will now be discussed. It is noted, however, that the present technology is not limited to these exemplary embodiments, and that the present technology also includes obvious variations of the exemplary embodiments and implementations described herein. It is further noted that various well-known circuit components, such as voltage sources and signal lines that may be implemented to create electric fields between two electrodes, are generally not illustrated in the drawings so as to not unnecessarily obscure various principles discussed herein, but that such well-known components may be implemented by those skilled in the art to practice various embodiments of the present technology.

Exemplary Structures

With reference now to FIG. 1, an oscillator package 100 in accordance with an embodiment is shown. Oscillator package 100 includes a resonator assembly 110, which may be a quartz resonator assembly. Resonator assembly 110 includes a piezoelectric member 111 and a number of resonator electrodes 112 coupled or affixed to piezoelectric member 111, wherein piezoelectric member 111 is coupled with and cantilevered relative to a substrate 120 at a base 113. In this manner, an electric field may be introduced across resonator electrodes 112 so as to oscillate resonator assembly 110 relative to substrate 120.

Oscillator package 100 also includes a cap wafer 130 coupled with substrate 120 such that resonator assembly 110 is encased or disposed between substrate 120 and cap wafer 130. Additionally, top and bottom electrostatic electrodes 140, 141 are respectively coupled with substrate 120 and cap wafer 130. In one embodiment, top and bottom electrostatic electrodes 140, 141 are positioned to produce electrostatic fields outside of piezoelectric member 111 for vibration damping.

With reference still to FIG. 1, in an embodiment, oscillator package 100 optionally includes a getter 150, a cooler element 160, a heater element 170 and/or a temperature sensor 180. Moreover, a number of metalized through wafer vias 190 are provided within substrate 120 and cap wafer 130 such that electric signals may be carried to and from various devices of oscillator package 100.

Pursuant to an exemplary implementation of oscillator package 100, resonator assembly 110 is excited at twice the fundamental frequency of a shear mode of the resonator. The square law nature of the electrostatic force naturally produces a stress on resonator assembly 110 at twice the operating frequency if a feedback loop is used to apply the resonant frequency signal to top or bottom electrostatic electrodes 140, 141. In one embodiment, a number of additional electrodes (not shown) are fabricated, such as along the side of piezoelectric member 111, to produce lateral stresses such that resonator assembly 110 may be parametrically driven.

Figure 2A:
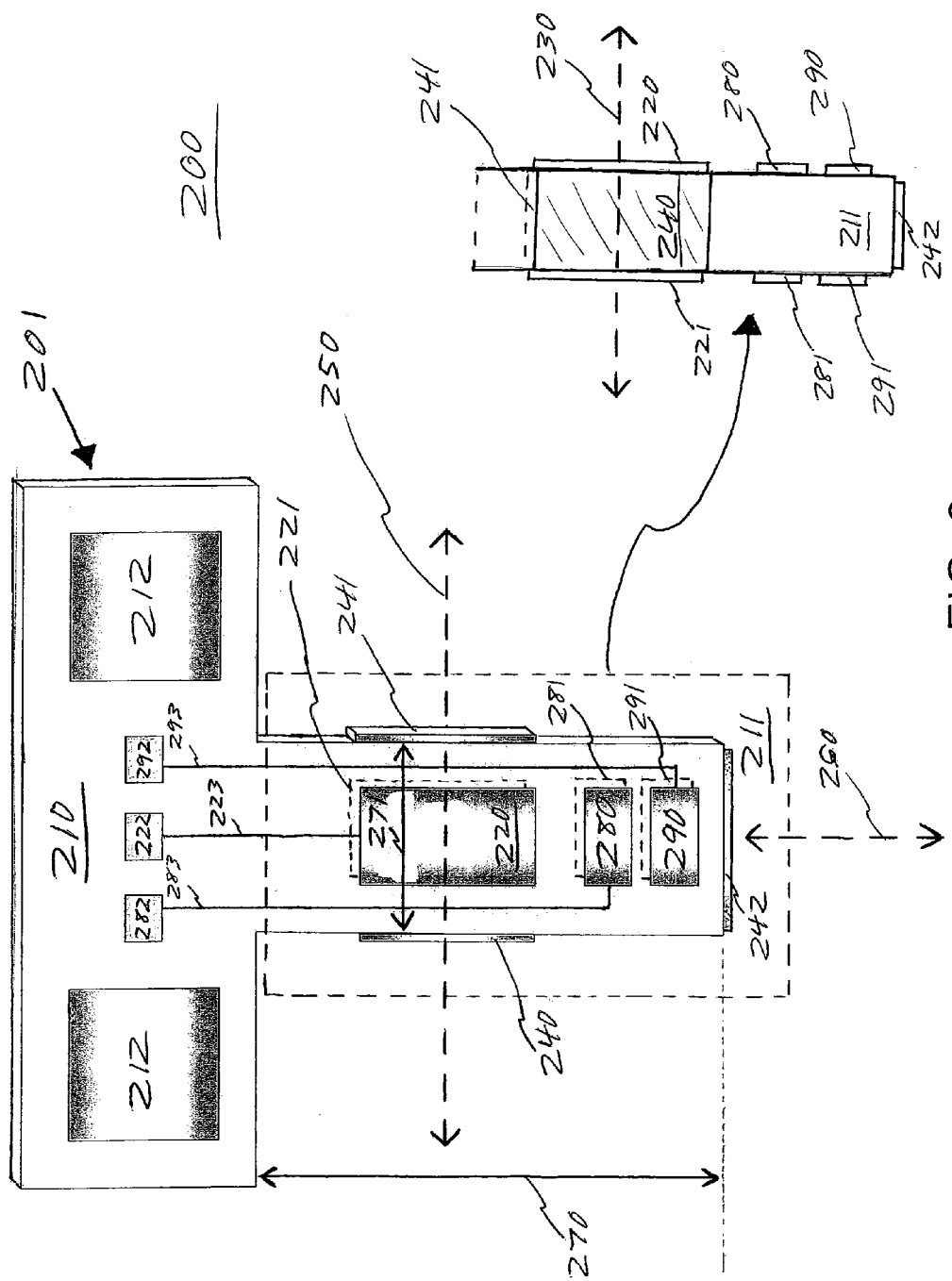
FIG. 2A is a top view of a first exemplary structure of a piezoelectric resonator, and a side view of an extension thereof, in accordance with an embodiment.

With reference now to FIG. 2A, a first exemplary configuration 200 of a piezoelectric resonator 201 in accordance with an embodiment is shown. Piezoelectric resonator 201 includes a piezoelectric member 210, which is sized to vibrate in a first direction at an operating or resonate frequency. Piezoelectric resonator 201 also includes a plurality of mounting pads 212 coupled with piezoelectric member 210 and positioned to enable piezoelectric member 210 to be coupled with and cantilevered relative to a substrate, such as substrate 120 shown in FIG. 1 (so as to serve as the resonator of oscillator package 100).

It is noted that piezoelectric member 210 may include a piezoelectric material such as quartz, although other piezoelectric materials may also be implemented. It is further noted that piezoelectric member 210 may be configured to be a thermally-compensated resonator, and that piezoelectric resonator 201 may be configured as a shear-mode resonator.

For thoroughness of illustration, both top and side views of an extension 211 of piezoelectric member 210 are shown in FIG. 2A. Piezoelectric resonator 201 also includes one or more of first and second resonator electrodes 220, 221, which are coupled with piezoelectric member 210 and positioned to enable an electric field to be generated in a first direction along a first axis 230. To illustrate, an example provides that first and second resonator electrodes 220, 221 are both coupled with piezoelectric member 210 along first axis 230, and an electric field is generated between first and second resonator electrodes 220, 221.

In a second example, wherein piezoelectric resonator 201 is integrated in an oscillator package such as shown in FIG. 1 (such as by replacing resonator assembly 110), an electrostatic field is generated between first resonator electrode 220 and a first electrostatic electrode, such as top electrostatic electrode 140. Alternatively, or in addition to the foregoing, an electrostatic field may be generated between second resonator electrode 221 and a second electrostatic electrode, such as bottom electrostatic electrode 141 shown in FIG. 1. Therefore, various embodiments may be implemented to generate one or more electric fields in a first direction along first axis 230, which is shown in FIG. 2, so as to oscillate or force rebalance piezoelectric member 210 relative to a substrate. This is particularly important when the oscillator is subject to high vibration levels (e.g., greater than 10 "g"s), yet wherein low phase noise is to be maintained.

With reference still to FIG. 2A, piezoelectric resonator 201 further includes one or more of first and second parametric drive electrodes 240, 241, which are coupled with piezoelectric member 210 and positioned to enable one or more electric fields to be generated in a second direction along a second axis 250. To illustrate, an example provides that first and second parametric drive electrodes 240, 241 are both coupled with piezoelectric member 210 along second axis 250, and an electric field is generated between first and second parametric drive electrodes 240, 241.

Figure 2B:
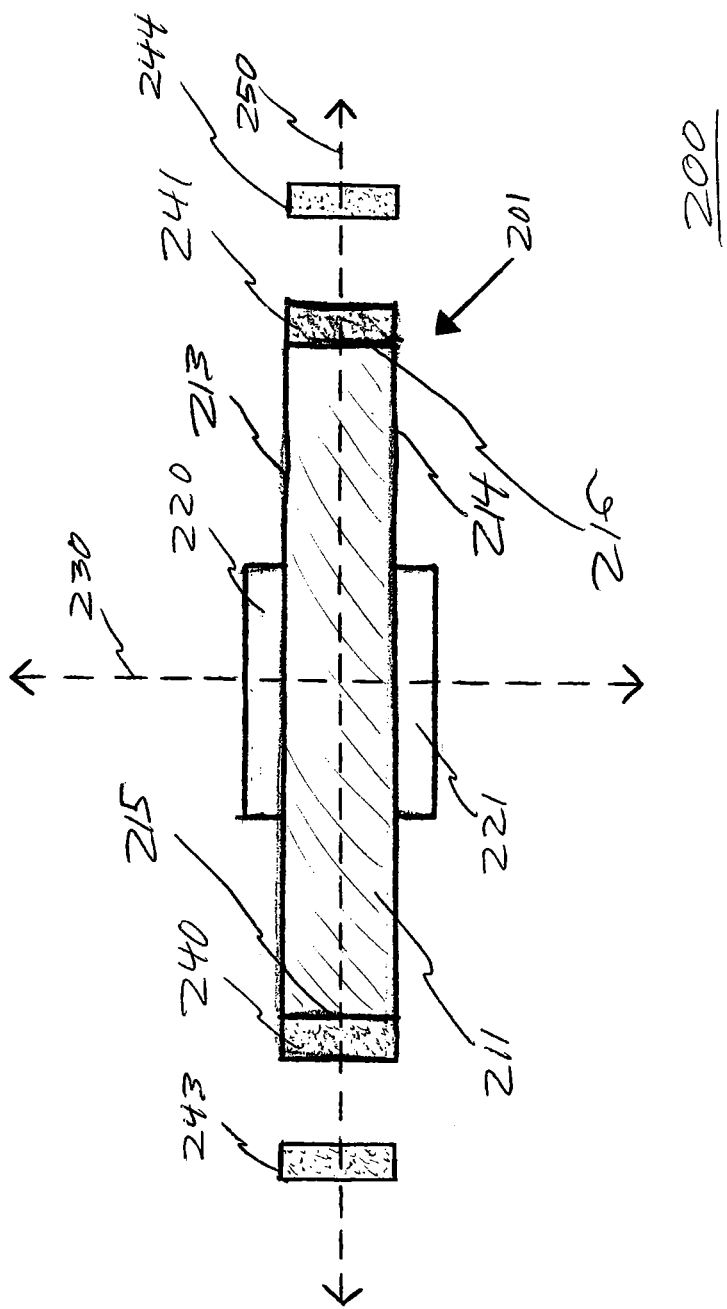
FIG. 2B is a cross-sectional view of a first exemplary structure of a piezoelectric resonator in accordance with an embodiment.

In a second example, an electrostatic field is generated between first parametric drive electrode 240 and a first laterally-positioned electrostatic electrode, such as first lateral drive electrode 243 shown in FIG. 2B (see infra). Alternatively, or in addition to the foregoing, an electrostatic field may be generated between second parametric drive electrode 241 and a second laterally-positioned electrostatic electrode, such as second lateral drive electrode 244 shown in FIG. 2B (see infra). Therefore, various embodiments may be implemented to generate one or more electric fields in a second direction along second axis 250, or along a third axis 260 (see infra), so as to parametrically drive piezoelectric member 210 in the second direction when piezoelectric member 210 is oscillating relative to a substrate in the aforementioned first direction.

Thus, an embodiment provides that first and/or second resonator electrodes 220, 221 are positioned to enable a first electric field to oscillate piezoelectric member 210 in a first direction, while first and/or second parametric drive electrodes 240, 241 are positioned to enable a second electric field to parametrically drive piezoelectric member 210 in a second direction. In so much as a number of parametric drive electrodes are positioned to induce a second electric field through piezoelectric member 210 in a direction other than the primary direction of oscillation, piezoelectric resonator 201 is configured for parametric amplification. In one exemplary implementation, first and second axes 230, 250 are normal or perpendicular to one another such that the first direction in which the first electric field is generated is normal or perpendicular to the second direction in which the second electric field is generated.

It is noted that first and second resonator electrodes 220, 221 and first and second parametric drive electrodes 240, 241 may be positioned at different locations along piezoelectric member 210. For purposes of illustration, however, an embodiment provides that first and second resonator electrodes 220, 221 are coupled or affixed to generally opposite sides of piezoelectric member 210 along first axis 230, and that first and second parametric drive electrodes 240, 241 are coupled or affixed to generally opposite sides of piezoelectric member 210 along second axis 250, or third axis 260, normal or perpendicular to first axis 230. Indeed, this may be the case where extension 211 of piezoelectric member 210 is rectangular in shape, and where each of first and second resonator electrodes 220, 221 and first and second parametric drive electrodes 240, 241 are placed on different juxtaposed sides of extension 211 such as shown in FIG. 2A.

To further illustrate, and with reference now to FIG. 2B, a cross-sectional view of piezoelectric resonator 201 of first exemplary configuration 200 in accordance with an embodiment is shown. In particular, FIG. 2B illustrates a cross-section of extension 211 along third axis 260, wherein extension 211 of piezoelectric member 210 has a top surface 213, a bottom surface 214, and first and second side surfaces 215, 216. First and second resonator electrodes 220, 221 are respectively coupled to the top and bottom surfaces 213, 214, and first and second parametric drive electrodes 240, 241 are respectively coupled to the first and second side surfaces 215, 216. In this manner, each of first and second resonator electrodes 220, 221 and first and second parametric drive electrodes 240, 241 are placed on different sides of extension 211, which may have a rectangular shape as shown.

In accordance with an exemplary implementation, a degree of lateral field excitation is used to parametrically drive piezoelectric member 210 in the aforementioned second direction, such as along second axis 250. Such lateral field excitation may be achieved, for example, by generating a lateral electric field through or across piezoelectric member 210 in a second direction, which is in addition to the first electric field that oscillates piezoelectric member 210 in the aforementioned first direction, by presenting a voltage differential across first and second parametric drive electrodes 240, 241. In this manner, it is noted that first and second parametric drive electrodes 240, 241 are positioned to enable a second electric field to be generated through or across piezoelectric member 210 in the second direction which has a stabilizing effect on the mechanical vibration of piezoelectric member 210 when in operation.

In one embodiment, however, one or more lateral electrostatic forces are generated outside of piezoelectric member 210 by a number of lateral electrostatic electrodes. To illustrate, and with reference still to FIG. 2B, an example provides that first lateral drive electrode 243, which may be coupled with a side or lateral portion of substrate 120 in FIG. 1, is positioned such that an electrostatic field may be generated between first parametric drive electrode 240 and first lateral drive electrode 243, wherein this lateral electrostatic field constitutes a parametrically driving force for piezoelectric member 210. Alternatively, or in addition to the foregoing, second lateral drive electrode 244, which may also be coupled with a side or lateral portion of substrate 120, may be positioned such that an electrostatic field may be generated between second parametric drive electrode 241 and second lateral drive electrode 244.

In one embodiment, a parametric drive electrode 242 is coupled with an end of piezoelectric member 210 (on a third side of extension 211), wherein parametric drive electrode 242 is positioned to stress piezoelectric member 210 in the aforementioned third direction during an oscillation of piezoelectric member 210.

Figure 2C:
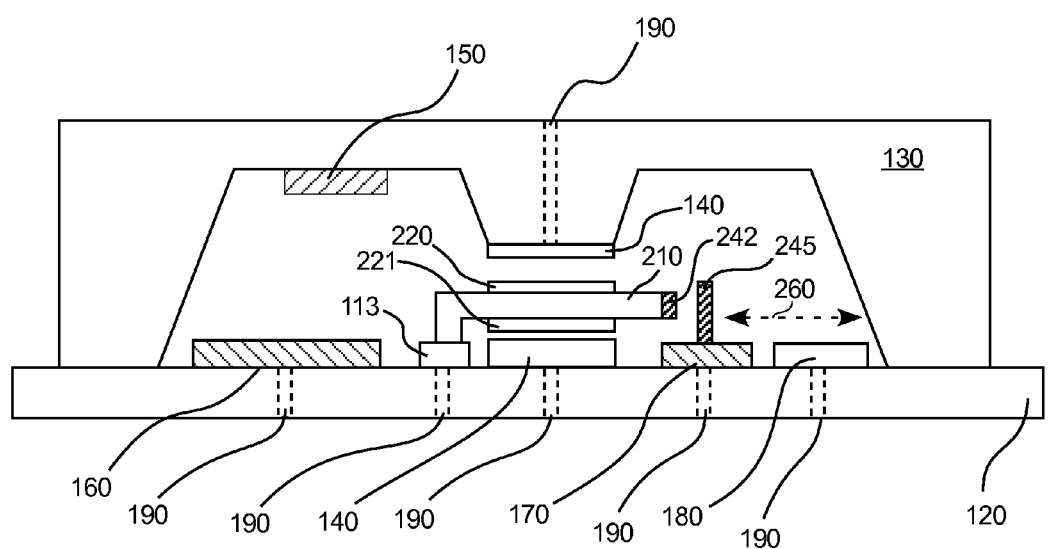
FIG. 2C is a side view of a piezoelectric resonator integrated in an oscillator package in accordance with an embodiment.

To illustrate, and with reference now to FIG. 2C, a side view of piezoelectric member 210 integrated in an oscillator 202 in accordance with an embodiment is shown. It is noted that piezoelectric member 210 may include first and second parametric drive electrodes 240, 241 (as shown in FIGS. 2A and 2B, but not in FIG. 2C). It is further noted that parametric drive electrode 242 is coupled with an end of piezoelectric member 210. Moreover, a drive electrode 245 is coupled with substrate 120. In this manner, an electrostatic force may be generated between parametric drive electrode 242 and drive electrode 245 so as to parametrically amplify piezoelectric member 210.

The foregoing notwithstanding, is noted that piezoelectric member 210 may be sized pursuant to a specific application of piezoelectric resonator 201. In one embodiment, wherein the resonator is configured for use in the ultra-high frequency (UHF) band, extension 211 has a length 270 of 180 μm and/or a width 271 of 50 μm. Indeed, an embodiment provides that first and second parametric drive electrodes 240, 241 are coupled or affixed to generally opposite sides of piezoelectric member 210, wherein a distance between these generally opposite sides is less than or equal to 50 μm.

Thus, an embodiment provides an integrated parametrically driven shear-mode quartz resonator. The side electrodes for producing the electric field and/or stress at twice the operating or resonate frequency of piezoelectric member 210 are shown in FIGS. 2A and 2B. By keeping the width of the resonator narrow (e.g., less than or equal to 50 μm), the electric field is sufficient to produce a strong parametric amplification at low voltages, wherein the dimensions are consistent with an optimized design for an AT-cut quartz resonator having an operating or resonate frequency near 1 gigahertz ("GHz").

With reference still to FIG. 2A, piezoelectric resonator 201 may optionally include a plurality of capacitive sense electrodes 280, 281 and/or a plurality of force rebalance electrodes 290, 291 coupled or affixed to extension 211, wherein these electrodes are positioned to control an amplitude of vibration of piezoelectric resonator 201 in the direction of oscillation. Moreover, an embodiment provides that piezoelectric resonator 201 includes a number of electrically conductive vias and corresponding signal lines (such as metalized vias 222, 282, 292 and traces 223, 283 and 293 shown in FIG. 2A) positioned to transmit signals to one or more of the electrodes of piezoelectric resonator 201.

Figure 3:
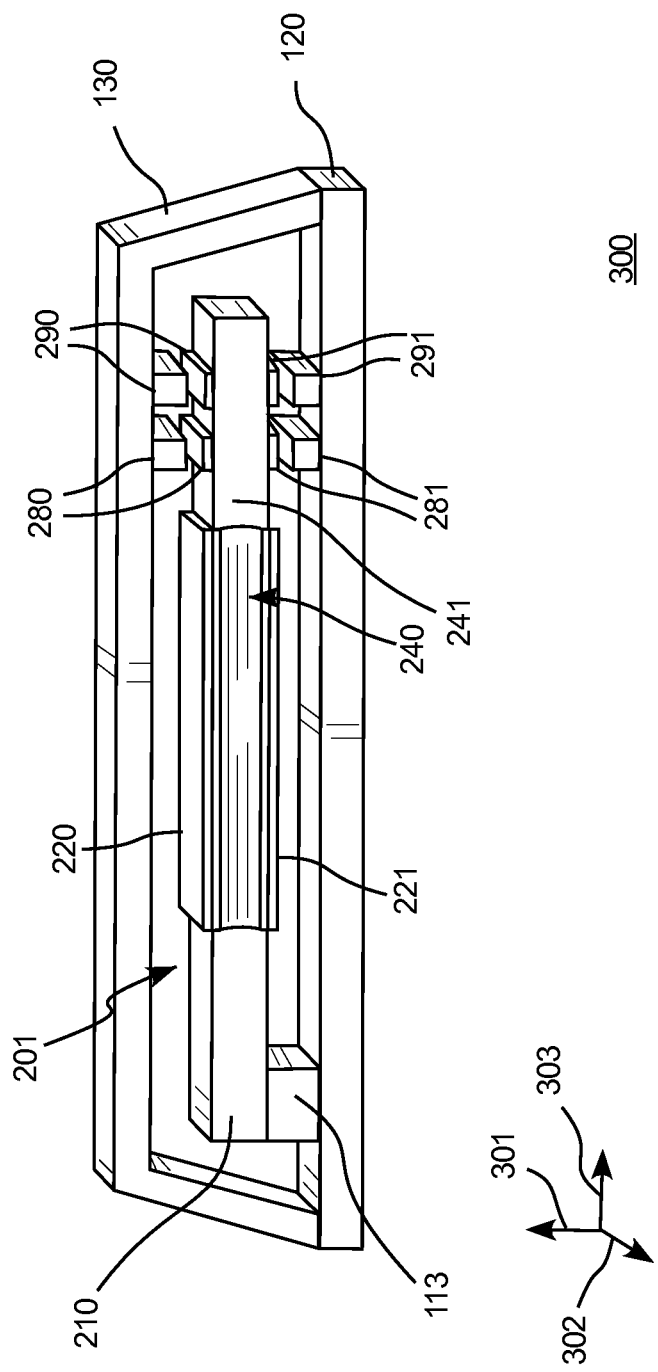
FIG. 3 is a perspective view of an oscillator in accordance with an embodiment.

With reference now to FIG. 3, an oscillator 300 in accordance with an embodiment is shown. For purposes of clarity, directions of vertical field excitation 301, lateral field excitation 302 and thickness shear mode excitation 303 are referenced.

Oscillator 300 includes a cap wafer 130 coupled with substrate 120 such that piezoelectric resonator 201 is encased or disposed between substrate 120 and cap wafer 130, wherein piezoelectric member 210 is coupled with and cantilevered relative to substrate 120 at base 113. As previously described, first and second resonator electrodes 220, 221 as well as first and second parametric drive electrodes 240, 241 are coupled with piezoelectric member 210 such that piezoelectric resonator 201 may be parametrically driven during an induced oscillation of piezoelectric member 210. Moreover, oscillator 300 may optionally include a number of corresponding capacitive sense electrodes 280, 281 for general rebalancing, as well as a number of force rebalance electrodes 290, 291 (such as top and bottom electrostatic electrodes 140, 141 shown in FIGS. 1 and 2C) for vibration control rebalancing.

Thus, it is noted that piezoelectric resonator 201 as described herein may be implemented in an oscillator package. Therefore, an exemplary implementation provides that the resonator assembly 110 of oscillator package 100 shown in FIG. 1 is the piezoelectric resonator 201 described herein.

It is further noted that the present technology is not limited to the specific positioning of elements shown in FIGS. 2A and 2B. Indeed, different arrangements of the elements discussed herein may be implemented.

Figure 4A:
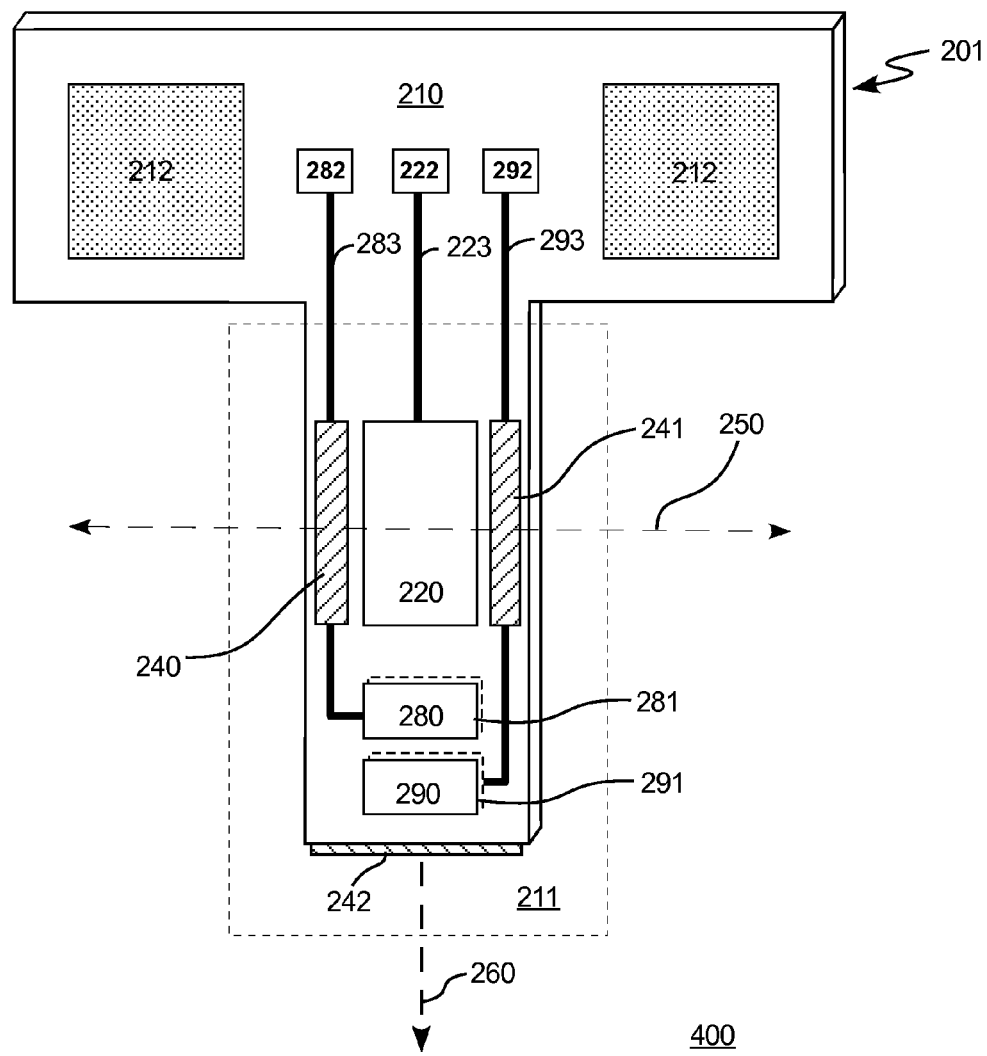
FIG. 4A is a top view of a second exemplary structure of a piezoelectric resonator in accordance with an embodiment.
Figure 4B:
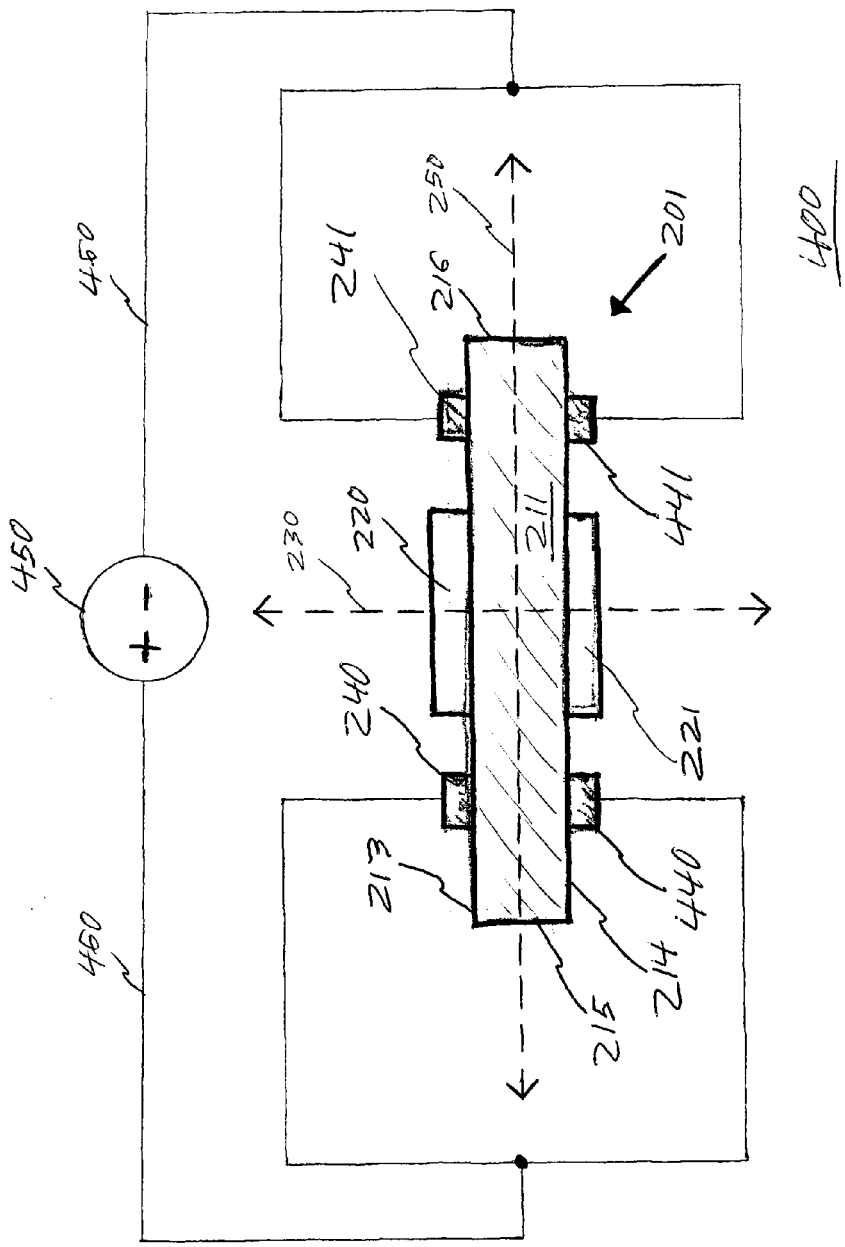
FIG. 4B is a cross-sectional view of a second exemplary structure of a piezoelectric resonator in accordance with an embodiment.

To illustrate, and with reference now to FIGS. 4A and 4B, a second exemplary structure 400 of piezoelectric resonator 201 in accordance with an embodiment is shown. In particular, it is shown that extension 211 of piezoelectric member 210 has a top surface 213, a bottom surface 214, and first and second side surfaces 215, 216. In addition to first and second resonator electrodes 220, 221 and first and second parametric drive electrodes 240, 241, piezoelectric resonator further includes third and fourth parametric drive electrodes 440, 441, wherein first resonator electrode 220 and first and second parametric drive electrodes 240, 241 are coupled to the top surface 213, and wherein second resonator electrode 221 and third and fourth parametric drive electrodes 440, 441 are coupled to said bottom surface. In this manner, first resonator electrode 220 is positioned between two parametric drive electrodes on one surface of extension 211, and second resonator electrode 221 is positioned between two other parametric drive electrodes on another surface of extension 211, which is in contrast to the exemplary configuration shown in FIGS. 2A and 2B.

It is noted, however, that parametric drive electrode 242 may also be coupled with extension 211 such that piezoelectric member 210 may be parametrically driven in a direction of shear along third axis 260, such as in the manner discussed above with regard to FIG. 2C. Thus, an embodiment provides that one or more electrostatic drive electrodes may be implemented with the piezoelectric resonator of second exemplary structure 400.

With reference still to FIG. 4B, an exemplary implementation provides that a power source 450 and transmission lines 460 are used to provide a voltage between first and third parametric drive electrodes 240, 440 and second and fourth parametric drive electrodes 241, 441 such that a lateral electric field is generated across extension 211 of piezoelectric member 210 in the aforementioned second direction (e.g., along second axis 250). Thus, rather than using two parametric drive electrodes to generate a single parametric drive force, an embodiment provides that more than two of such electrodes (e.g., four parametric drive electrodes) may be implemented to generate this single lateral force within piezoelectric member 210.

As previously mentioned, however, other arrangements of the various elements discussed herein may be implemented. Indeed, for narrow, UHF MEMS resonator designs, the drive electrodes can be applied to the side, top and/or bottom surfaces of the resonator to provide sufficient lateral electric fields at relatively low voltages. Furthermore, a greater or lesser number of parametric drive electrodes may be affixed to extension 211, such as where six or more parametric drive electrodes are positioned around first and second resonator electrodes 220, 221.

For temperature compensated resonators such as AT-cut shear-mode resonators, an embodiment provides that the shear-modulus is modulated at twice the operating frequency for parametric amplification to be achieved. Indeed, by applying an electric field at sufficient amplitude laterally across the device, such as normal to the direction of shear, one can modulate the shear modulus. In an exemplary implementation, the amount of shear-modulus variation that can be obtained for a given UHF AT-cut resonator geometry and applied voltage may be calculated.

As previously mentioned, various well-known circuit components, such as voltage sources and signal lines that may be implemented to create electric fields between two electrodes, are generally not illustrated in the drawings so as to not unnecessarily obscure various principles discussed herein. However, such well-known components may be implemented by those skilled in the art to practice various embodiments of the present technology. Indeed, in one embodiment, one or more voltage sources (such as power source 450) as well as a number of signal lines (such as traces 223, 283 and 293 or transmission lines 460) are implemented to generate an electric field between various electrodes discussed herein.

Figure 5:
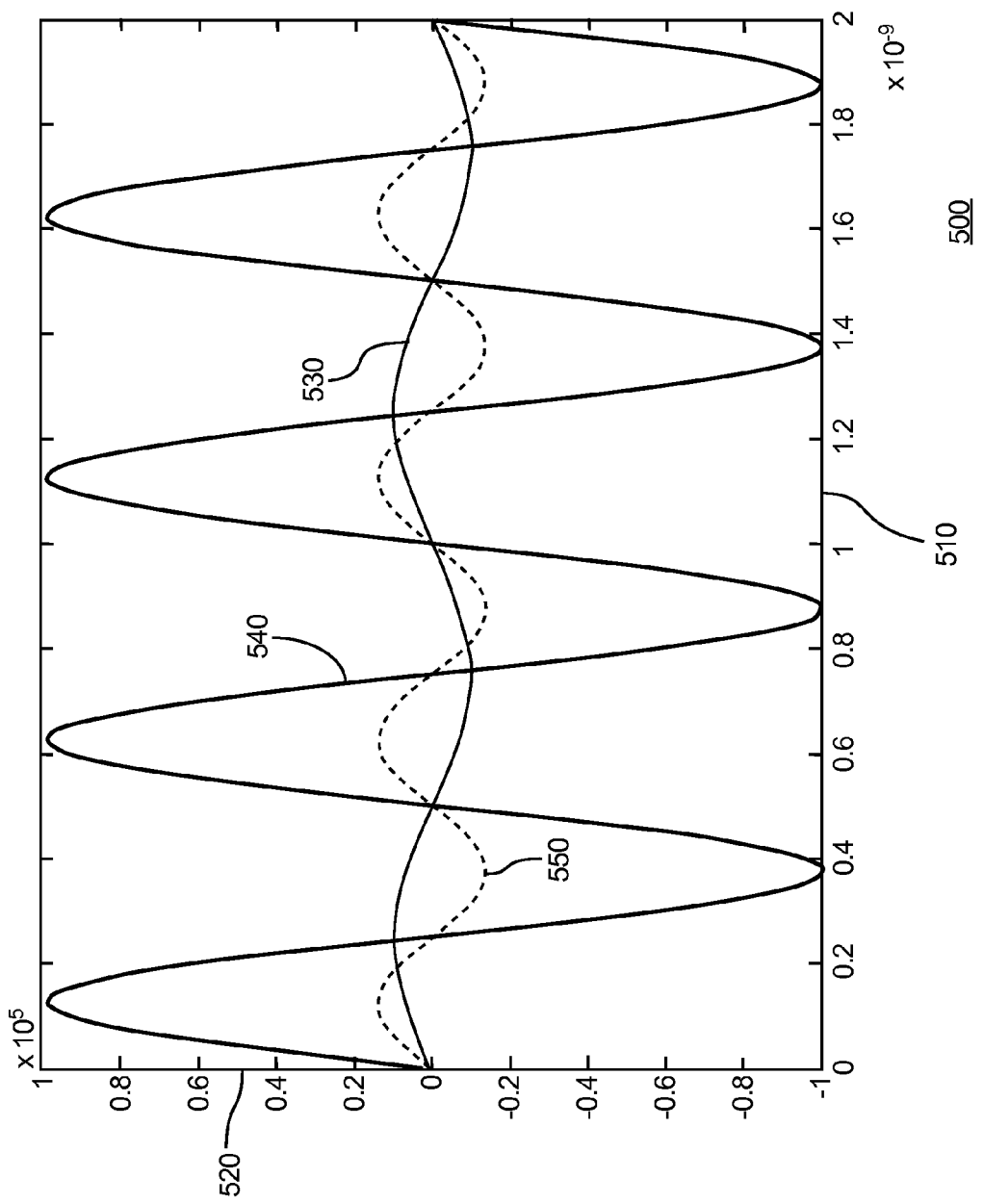
FIG. 5 is a graph of exemplary electric fields and a resulting shear modulus in accordance with an embodiment.

For purposes of illustration, and with reference now to FIG. 5, a graph 500 of exemplary electric fields and a resulting shear modulus in accordance with an embodiment is shown.

These exemplary electric fields are related to thickness shear mode excitation $E_y(f_0)$, lateral field excitation $E_z(2f_0)$ and resulting shear modulus $\Delta k/k(2f_0)$, wherein "$f_0$" is the operating or resonate frequency of the piezoelectric resonator, and wherein "k" is a shear modulus constant associated with the implemented piezoelectric material. More specifically, graph 500 includes a horizontal axis 510 that measures time in temporal units of seconds, as well as a vertical axis 520 that measures amplitude as a function of time. Three different plots are shown in graph 500, wherein these plots include a first plot 530 of $10 \times E_y(f_0)$ volts "V" per meter "m" ("V/m"), a second plot 540 of $E_z(2f_0)$ V/m, and a third plot 550 of $10^8 \times \Delta k/k(2f_0)$.

With reference still to the previous embodiment, if a voltage of ±20 V is applied, such as by electronically coupling a ±10 V power supply to first and second parametric drive electrodes 240, 241, across a 50 μm region in quartz, a field of $±1 \times 10^5$ V/m can be generated within the quartz. A field $E_z$ of this amplitude at a frequency of $2 \times f_0$ is plotted in FIG. 5 along with the operating field $E_y$ at $f_0$ for a 1 GHz resonator. The change in the shear-modulus is also plotted due to nonlinear strain effects in the quartz. It is shown that a fractional change in the shear-modulus of $1.5 \times 10^{-4}$ may be obtained. This level of shear modulus change is sufficient to produce relatively strong parametric gain for a starting Q of 13K. It is noted that this level of Q has been demonstrated for 1 GHz UHF quartz resonators.

Thus, principles of the present technology may be implemented to obtain a relatively strong parametric gain with relatively low voltage supplies in 1 GHz oscillators. In so much as quartz oscillators have traditionally been manufactured as discrete high-frequency devices packaged in large ceramic packages, the ability to modulate the elastic modulus with low drive voltages has been limited. This underscores the utility of the present technology, wherein the electrodes may be integrated on a precisely etched, relatively small UHF resonator such that the electrodes are positioned to efficiently induce piezoelectric stress.

Moreover, low phase noise oscillators are an important component in radar and communication systems. Since the phase noise for close to carrier applications is proportional to $1/Q^2$ at a constant frequency, an improvement in Q of a $10 \times Q$ represents a reduction in phase noise "$S_\phi$" of $10^{-2} \times S_\phi$, or 20 dBc/Hz. This is a significant improvement in phase noise, which may be used to improve Doppler radar and GPS accuracy, while minimizing communication noise levels near high power transmitters by allowing narrow band filtering. In addition, a lower degree of power consumption may be achieved in communication system designs (while keeping in mind that such systems will realize lower noise floors for the receivers), which is critical for portable and hand-held devices.

It is further noted that parametric amplification techniques were not previously applied to shear-mode quartz oscillators before the conception of the present integration technology discussed herein, which is likely due to the limitations of producing large electric fields in larger, low frequency resonators. Furthermore, similar results are not achieved when different techniques are implemented. For example, in the case of MEMS-based silicon resonators, thermally induced changes, such as by implementing a laser, may be used to modulate the elastic constant of a flexural mode resonator. For example, pulsed laser heating techniques may be implemented to induce a change in the elastic modulus of the silicon resonator. However, this heating technique has been applied to devices with low resonant frequencies, low initial Qs, and high temperature sensitivity. Thus, only small amplification factors are obtained, and no improvement in phase noise was achieved.

In a second example, electrostatic drive signals are applied to specially designed springs near the active resonator of a silicon nano-resonator, and amplification by a factor of approximately 5 to 10 times the resonant frequency is achieved. However, again the original Q is low for this design, the impedance to matching to sustaining electronics was high, and the resonator is not highly stable when experiencing normal operating temperatures. Thus, these resonators would have relatively limited use in high performance systems.

Exemplary Methodologies

Various exemplary methods of use and fabrication will now be discussed. It is noted, however, that the present technology is not limited to these exemplary embodiments.

With reference now to FIG. 6, a first exemplary method 600 of using parametric amplification to increase a quality factor of a piezoelectric resonator, such as piezoelectric resonator 201, in accordance with an embodiment is shown. First exemplary method 600 includes generating a first electric field between first and second resonator electrodes so as to oscillate a piezoelectric member of the piezoelectric resonator in a first direction at an operating or resonate frequency 610. First exemplary method 600 further includes generating a second electric field between first and second parametric drive electrodes so as to exert a degree of strain on the piezoelectric member in a second direction at twice the operating or resonate frequency to thereby parametrically drive the piezoelectric member in the second direction 620.

Exemplary structural configurations that may be implemented to perform first exemplary method 600 are shown in FIGS. 2A and 2B, and in FIGS. 4A and 4B, although the present technology is not limited to these exemplary structural configurations. In an embodiment, a method of use as discussed herein may also include the selection of the specific piezoelectric resonator to be implemented.

Figure 7:
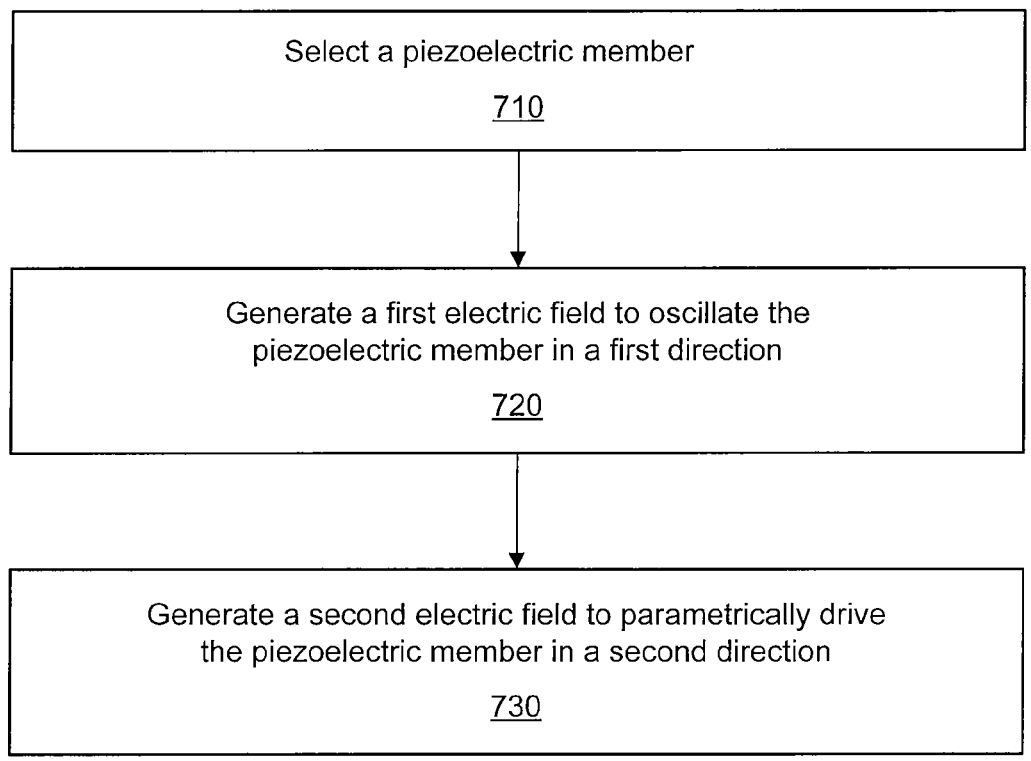
FIG. 7 is a second exemplary method of using parametric amplification to increase a quality factor of a piezoelectric resonator in accordance with an embodiment.

To illustrate, and with reference now to FIG. 7, a second exemplary method 700 of using parametric amplification to increase a quality factor of a piezoelectric resonator in accordance with an embodiment is shown. Second exemplary method 700 includes selecting a piezoelectric member 710. For example, a piezoelectric member that includes quartz may be selected, wherein the selected member is included within a thermally-compensated, shear-mode resonator. Additionally, second exemplary method 700 includes generating a first electric field to oscillate the piezoelectric member in a first direction 720, and generating a second electric field to parametrically drive the piezoelectric member in a second direction 730.

In an embodiment, the piezoelectric member is associated with an elastic or shear modulus and is sized to vibrate in the first direction at an operating or resonate frequency. Moreover, second exemplary method 700 further includes varying or modulating the elastic or shear modulus at twice the operating or resonate frequency to vibrate the piezoelectric member within a range of $10^4$ to $10^5$ times a force of gravity and achieve a reduction in phase noise of at least 20 dBc/Hz.

Thus, pursuant to an exemplary implementation, parametric amplification is used to increase the quality factor of electronic oscillators whereby the stiffness of the system (e.g., the capacitance of an electrical oscillator or the elastic constant for a mechanical oscillator) is modulated at twice the natural resonant frequency. This overtone modulation can be shown to significantly increase the amplitude of the forced oscillator resonance, thereby effectively increasing the quality factor.

It is noted that, using the parametric amplification equation for a driven harmonic oscillator, the resonant condition for infinite amplitude is $2b=\Delta k/k$, where $b=1/Q$ of the undriven system. Thus, for a Q of $10^4$, $\Delta k/k=2\times 10^{-4}$. For low frequency devices which vibrate in the flexural or extensional modes, this level of elastic modulus variation can be accomplished using electrostatic forces applied with electrodes located a few microns away from the resonator. Since forces near $10^4$ to $10^5$ times a force of gravity ("g") can be generated at low voltages with micron size gaps, the fractional frequency or elastic modulus can be modulated to a level of $10^{-4}$ if the g sensitivity is $\geq 10^{-9}$/g. Since most flexural and extensional modes have g-level sensitivities larger than this level, this becomes a practical approach. Examples of this structure are shown in FIGS. 1, 2A and 2B.

The foregoing notwithstanding, for shear-mode resonators, the fundamental shear-mode frequency is usually much larger than the lower-order flexural, extensional, or torsional modes, thus making it more difficult (since the displacement of a resonator falls off rapidly above the resonant frequency of its extensional, flexural, or torsional modes) to obtain high frequency uniform strains within the resonator using electrostatic forces. In addition, the shear-modulus does not couple directly to extensional modes, making the g-sensitivity much less than $10^{-9}$/g for in-plane stress. Both of these effects increase the voltage requirements for producing parametric amplification using mechanical stress excitations. However, if side electrodes are applied to narrow resonators, an electric field applied laterally across the piezoelectric member, such as along second axis 250, can modulate the shear modulus in a horizontal direction, such as along third axis 260, to the degree stated above through internally generated piezoelectric stain using voltages that can be generated on chip. Example of this integrated structure are shown in FIGS. 2A, 3, 4A and 4B.

Figure 8:
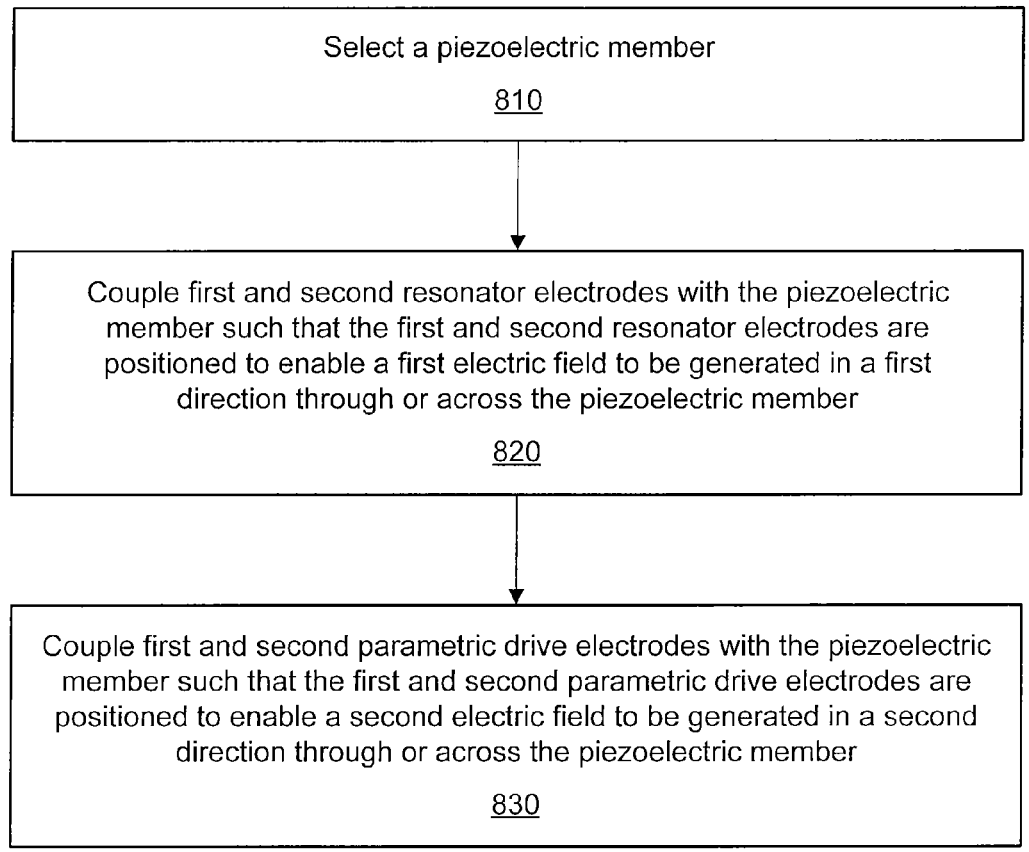
FIG. 8 is a method of configuring a piezoelectric resonator for parametric amplification in accordance with an embodiment.

With reference now to FIG. 8, a method 800 of configuring a piezoelectric resonator for parametric amplification in accordance with an embodiment is shown. Method 800 includes selecting a piezoelectric member 810, and coupling first and second resonator electrodes with the piezoelectric member such that the first and second resonator electrodes are positioned to enable a first electric field to be generated in a first direction through or across the piezoelectric member 820. Method 800 also includes coupling first and second parametric drive electrodes with the piezoelectric member such that the first and second parametric drive electrodes are positioned to enable a second electric field to be generated in a second direction through or across the piezoelectric member 830.

In one embodiment, method 800 includes selecting a material including quartz, cutting the piezoelectric member from the material, and sizing the piezoelectric material to be a thermally-compensated, shear-mode, quartz resonator. Moreover, an embodiment provides that method 800 includes coupling a plurality of mounting pads with the piezoelectric member such that the plurality of mounting pads are positioned to enable the piezoelectric member to be coupled with and cantilevered relative to a substrate. Indeed, an embodiment provides that method 800 includes sizing the piezoelectric member to vibrate in the first direction at an operating or resonate frequency, wherein the piezoelectric member is associated with an elastic or shear modulus capable of being varied or modulated at twice the operating or resonate frequency so as to vibrate the piezoelectric member within a range of $10^4$ to $10^5$ times a force of gravity and achieve a reduction in phase noise of at least 20 dBc/Hz.

The foregoing notwithstanding, in an embodiment, method 800 includes coupling the first and second resonator electrodes with generally opposite sides of the piezoelectric member along a first axis, and coupling the first and second parametric drive electrodes with generally opposite sides of the piezoelectric member along a second axis normal or perpendicular to the first axis. Indeed, pursuant to one embodiment, method 800 includes sizing a portion of the piezoelectric member to have a width of less than or equal to 50 µm, and coupling the first and second parametric drive electrodes with generally opposite sides of the portion of the piezoelectric member such that a distance between the first and second parametric drive electrodes is less than or equal to 50 µm.

Furthermore, and in accordance with an exemplary implementation, method 800 includes coupling the first and second resonator electrodes and the first and second parametric drive electrodes with the piezoelectric member such that the first direction is normal or perpendicular to the second direction, and such that both of the first and second directions are normal or perpendicular to a direction of shear associated with the piezoelectric member. Indeed, this configuration allows the application of an electric field at sufficient amplitude laterally across the piezoelectric member, such as normal to the direction of shear, to cause the shear modulus to be modulated.

Upon reviewing the instant disclosure of the present technology, the utility of the various embodiments discussed therein will be recognized by those skilled in the art. In so much as quartz oscillators have traditionally been manufactured as discrete HF devices packaged in large ceramic packages, the ability to modulate the elastic modulus with low drive voltages has been limited. For example, the quartz may be manufactured on separate quartz plates, singulated, and then bonded within ceramic packages for hermitic packaging. These packages are then attached to printed circuit boards for integration with other electronics for a variety of communication applications. However, pursuant to an exemplary scenario, this manufacturing and packaging scheme does not allow electrodes to be placed near the active resonator for applying large non-linear external forces and strain.

In contrast, various embodiments of the present technology enable electrostatic actuation or lateral field excitation to be used to laterally strain a piezoelectric resonator at, for example, twice its resonant frequency to produce a variation in its elastic modulus which will parametrically amplify its fundamental mode amplitude. In this latter manner, the piezoelectric effect of the resonator is itself utilized in a lateral direction (e.g., normal to the directions of horizontal shear) to increase the quality factor of the resonator during operation. It is noted that this effect may be achieved at relatively high operational frequencies (such as in the gigahertz range), and with relatively low input voltages.

Summary Concepts

It is noted that the foregoing discussion has presented at least the following concepts:

1. A piezoelectric resonator configured for parametric amplification, the piezoelectric resonator including or comprising:
   a piezoelectric member;
   first and second resonator electrodes associated with the piezoelectric member and positioned to enable a first electric field to be generated in a first direction; and
   a first parametric drive electrode associated with the piezoelectric member and positioned to enable a second electric field to be generated in a second direction.

2. The piezoelectric resonator of Concept 1, wherein the piezoelectric member includes quartz.

3. The piezoelectric resonator of Concept 1, wherein the piezoelectric member is configured to be a thermally-compensated resonator.

4. The piezoelectric resonator of Concept 1, wherein the piezoelectric resonator is a shear-mode resonator.

5. The piezoelectric resonator of Concept 1, wherein the piezoelectric resonator is sized to operate in the ultra-high frequency (UHF) band.

6. The piezoelectric resonator of Concept 1, wherein the first direction is normal or perpendicular to the second direction.

7. The piezoelectric resonator of Concept 1, wherein a degree of shear in a third direction is associated with the piezoelectric member, and wherein the first and/or second electric fields are normal or perpendicular to the third direction.

8. The piezoelectric resonator of Concept 1, wherein the piezoelectric member is associated with an elastic or shear modulus at an operating or resonate frequency with side electrodes capable of producing electrostatic forces at approximately twice the operating or resonate frequency so as to modulate the elastic or shear modulus.

9. The piezoelectric resonator of Concept 8, wherein the electrostatic forces are equivalent to vibration levels of $10^4$ to $10^5$ times a force of gravity.

10. The piezoelectric resonator of Concept 8, wherein the electrostatic forces are produced within an electrode gap of less than 10 microns ($\mu$m) in separation.

11. The piezoelectric resonator of Concept 1, further including or comprising:
a plurality of mounting pads associated with the piezoelectric member and positioned to enable the piezoelectric member to be coupled with and cantilevered relative to a substrate.

12. The piezoelectric resonator of Concept 1, further including or comprising:
a parametric electrode associated with the piezoelectric member and positioned to enable a third electric field to be generated in a third direction corresponding to a direction of shear associated with the piezoelectric member.

13. The piezoelectric resonator of Concept 1, further including or comprising:
a plurality of capacitive sense electrodes and a plurality of force rebalance electrodes associated with the piezoelectric member and positioned to stabilize the piezoelectric resonator under vibration.

14. The piezoelectric resonator of Concept 1, further including or comprising:
a second parametric drive electrode associated with the piezoelectric member, the first and second parametric drive electrodes positioned to enable the second electric field to be generated through or across the piezoelectric member in the second direction.

15. An oscillator including or comprising:
a substrate;
the piezoelectric resonator of Concept 1, the piezoelectric member being coupled with and cantilevered relative to the substrate; and
a second parametric drive electrode associated with the substrate and separated from the piezoelectric member, the second parametric drive electrode positioned to enable the second electric field to be generated adjacent to the piezoelectric member so as to electrostatically drive the piezoelectric member in the second direction.

16. A piezoelectric resonator configured for parametric amplification, the piezoelectric resonator including or comprising:
a piezoelectric member;
a first resonator electrode associated with the piezoelectric member and positioned to enable a first electric field to be generated in a first direction; and
first and second parametric drive electrodes associated with the piezoelectric member and positioned to enable a second electric field to be generated in a second direction.

17. The piezoelectric resonator of Concept 16, wherein the first and second parametric drive electrodes are coupled or affixed to generally opposite sides of the piezoelectric member, and wherein a distance between the generally opposite sides is less than or equal to 50 microns ($\mu$m).

18. The piezoelectric resonator of Concept 16, further including or comprising:
a second resonator electrode associated with the piezoelectric member and positioned to enable the first electric field to be generated in the first direction through or across the piezoelectric member.

19. The piezoelectric resonator of Concept 18, wherein the piezoelectric member has at least a top surface, a bottom surface, and first and second side surfaces, the first and second resonator electrodes being respectively coupled to the top and bottom surfaces, and the first and second parametric drive electrodes being respectively coupled to the first and second side surfaces.

20. The piezoelectric resonator of Concept 19, wherein the first and second resonator electrodes are coupled or affixed to the piezoelectric member along a first axis, and wherein the first and second parametric drive electrodes are coupled or affixed to the piezoelectric member along a second axis normal or perpendicular to the first axis.

21. The piezoelectric resonator of Concept 18, wherein the piezoelectric member has at least a top surface and a bottom surface, the piezoelectric resonator further including or comprising:
third and fourth parametric drive electrodes associated with the piezoelectric member and positioned to enable the second electric field to be generated in the second direction through or across the piezoelectric member, the first resonator electrode and the first and second parametric drive electrodes being coupled to the top surface, and the second resonator electrode and the third and fourth parametric drive electrodes being coupled to the bottom surface.

22. The piezoelectric resonator of Concept 19, further including or comprising:
a parametric drive electrode associated with the piezoelectric member and positioned to enable a third electric field to be generated in a third direction corresponding to a direction of shear associated with the piezoelectric member.

23. A piezoelectric resonator comprising:
a piezoelectric member;
a resonator electrode associated with the piezoelectric member and positioned to enable a first electric field to be generated in a first direction; and
a plurality of capacitive sense and/or force rebalance electrodes associated with the piezoelectric member and positioned to control an amplitude of vibration of the piezoelectric resonator in the first direction.

24. The piezoelectric resonator of Concept 23, further including or comprising:
a parametric drive electrode associated with the piezoelectric member and positioned to enable a second electric field to be generated in a second direction.

Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. A piezoelectric resonator comprising:
a piezoelectric member;
a resonator electrode associated with said piezoelectric member and positioned to enable a first electric field to be generated in a first direction; and
a plurality of capacitive sense and/or force rebalance electrodes associated with said piezoelectric member and positioned to control an amplitude of vibration of said piezoelectric resonator in said first direction.

2. The piezoelectric resonator of claim 1, further comprising: a parametric drive electrode associated with said piezoelectric member and positioned to enable a second electric field to be generated in a second direction.

3. The piezoelectric resonator of claim 1 wherein the piezoelectric member is a cantilevered quartz member mounted at one end thereof and suspended above a substrate.

4. The piezoelectric resonator of claim 1 wherein the plurality of capacitive sense and/or force rebalance electrodes being disposed on major surfaces of said cantilevered quartz member.

5. The piezoelectric resonator of claim 4 further including a cap member, the cap member and the substrate supporting electrodes opposing the plurality of capacitive sense and/or force rebalance electrodes associated with said piezoelectric member.

6. A piezoelectric resonator comprising:
a piezoelectric member;
resonator electrodes disposed on said piezoelectric member and positioned to enable a first electric field to be generated in a first direction in said piezoelectric member; and
a plurality of capacitive sense and/or force rebalance electrodes disposed on said piezoelectric member and positioned to control an amplitude of vibration of said piezoelectric resonator in said first direction, said plurality of capacitive sense and/or force rebalance electrodes being spaced from said resonator electrodes.

7. The piezoelectric resonator of claim 6, further comprising: a parametric drive electrode associated with said piezoelectric member and positioned to enable a second electric field to be generated in a second direction different than said first direction.

8. The piezoelectric resonator of claim 7, wherein the piezoelectric member is defined by a cantilevered member suspended at one end above a substrate, the plurality of capacitive sense and/or force rebalance electrodes being disposed on major surfaces of said cantilevered piezoelectric member and wherein said parametric drive electrode are disposed on minor surfaces of said cantilevered piezoelectric member.

9. The piezoelectric resonator of claim 6, wherein the piezoelectric member is defined by a cantilevered member suspended at one end above a substrate, the plurality of capacitive sense and/or force rebalance electrodes being disposed on major surfaces of said cantilevered piezoelectric member.

10. The piezoelectric resonator of claim 9, wherein said cantilevered member, in use, is stabilized in a neutral position spaced from said plurality of capacitive sense and/or force rebalance electrodes.

* * * * *